(12) United States Patent
Shiba

(10) Patent No.: US 12,100,597 B2
(45) Date of Patent: Sep. 24, 2024

(54) METHOD AND SYSTEM FOR FORMING PATTERNED STRUCTURES INCLUDING SILICON NITRIDE

(71) Applicant: ASM IP Holding B.V., Almere (NL)

(72) Inventor: Eiichiro Shiba, Hachioji (JP)

(73) Assignee: ASM IP Holding B.V. (NL)

( * ) Notice: Subject to any disclaimer, the term of this patent is extended or adjusted under 35 U.S.C. 154(b) by 223 days.

(21) Appl. No.: 17/712,017

(22) Filed: Apr. 1, 2022

(65) Prior Publication Data

US 2022/0319858 A1    Oct. 6, 2022

Related U.S. Application Data

(60) Provisional application No. 63/171,202, filed on Apr. 6, 2021.

(51) Int. Cl.

| | |
|---|---|
| H01L 21/308 | (2006.01) |
| C23C 16/34 | (2006.01) |
| C23C 16/455 | (2006.01) |
| C23C 16/515 | (2006.01) |
| C23C 16/56 | (2006.01) |
| H01J 37/32 | (2006.01) |
| H01L 21/02 | (2006.01) |
| H01L 21/311 | (2006.01) |

(52) U.S. Cl.
CPC ........ *H01L 21/3086* (2013.01); *C23C 16/345* (2013.01); *C23C 16/45538* (2013.01); *C23C 16/45544* (2013.01); *C23C 16/515* (2013.01); *C23C 16/56* (2013.01); *H01J 37/32449* (2013.01); *H01L 21/0217* (2013.01); *H01L 21/02274* (2013.01); *H01L 21/0228* (2013.01); *H01L 21/31122* (2013.01); *H01J 2237/332* (2013.01); *H01J 2237/334* (2013.01); *H01L 21/3081* (2013.01)

(58) Field of Classification Search
None
See application file for complete search history.

(56) References Cited

U.S. PATENT DOCUMENTS

| | | | |
|---|---|---|---|
| 9,564,309 B2 | 2/2017 | Niskanen | |
| 9,576,792 B2 | 2/2017 | Chen | |
| 9,637,823 B2 | 5/2017 | Knoops | |
| 9,824,881 B2 | 11/2017 | Niskanen | |
| 9,905,416 B2 | 2/2018 | Niskanen | |
| 10,072,337 B2 | 9/2018 | Knoops | |
| 10,395,917 B2 | 8/2019 | Niskanen | |
| 10,424,477 B2 | 9/2019 | Niskanen | |
| 10,480,078 B2 | 11/2019 | Knoops | |

(Continued)

*Primary Examiner* — Binh X Tran
(74) *Attorney, Agent, or Firm* — Snell & Wilmer L.L.P.

(57) ABSTRACT

Methods of forming patterned structures suitable for a multiple patterning process are disclosed. Exemplary methods include forming a silicon nitride layer overlying the substrate by providing a silicon precursor to the reaction chamber for a silicon precursor pulse period, providing a nitrogen reactant to the reaction chamber, providing a hydrogen reactant to the reaction chamber, and providing a plasma power to form a plasma within the reaction chamber for a plasma pulse period. An etch profile of sacrificial features on the substrate can be controlled by controlling an amount of hydrogen provided to the reaction chamber and/or using other process parameters.

19 Claims, 10 Drawing Sheets

(56) References Cited

U.S. PATENT DOCUMENTS

| | | | |
|---|---|---|---|
| 10,822,700 | B2 | 11/2020 | Knoops |
| 11,069,522 | B2 | 7/2021 | Niskanen |
| 2017/0316940 | A1* | 11/2017 | Ishikawa ............. H01L 21/0234 |
| 2020/0013611 | A1 | 1/2020 | Niskanen |
| 2021/0025059 | A1 | 1/2021 | Knoops |
| 2021/0098605 | A1* | 4/2021 | Wang .................. H01L 29/0673 |

* cited by examiner

→ Plasma damage direction

⇢ Chemical damage direction

METHOD AND SYSTEM FOR FORMING PATTERNED STRUCTURES INCLUDING SILICON NITRIDE

CROSS-REFERENCE TO RELATED APPLICATIONS

This application claims the benefit of U.S. Provisional Application No. 63/171,202, filed on Apr. 6, 2021, in the United States Patent and Trademark Office, the disclosure of which is incorporated herein in its entirety by reference.

FIELD OF INVENTION

The present disclosure generally relates to methods and systems for forming structures suitable for forming electronic devices. More particularly, examples of the disclosure relate to methods and systems for forming layers comprising silicon nitride.

BACKGROUND OF THE DISCLOSURE

During the manufacture of electronic devices, fine patterns of features can be formed on a surface of a substrate by patterning the surface of the substrate and removing material from the substrate surface using, for example, wet etch and/or dry etch processes. Photoresist is often used as a template for such patterning of a surface of a substrate.

A photoresist pattern can be formed by coating a layer of photoresist onto a surface of the substrate, masking the surface of the photoresist, exposing the unmasked portions of the photoresist to radiation, such as ultraviolet light or an electron beam, and removing a portion (e.g., the unmasked or masked portion) of the photoresist, while leaving a portion (e.g., the other of the unmasked or masked portion) of the photoresist on the substrate surface. Once the photoresist is patterned, the patterned photoresist can be used as a template for etching material on the substrate surface in regions in which the photoresist was removed to form a transferred pattern in a layer underlying the photoresist. After etching, remaining photoresist can be removed.

As a size of devices decreases, traditional photoresist techniques may not be suitable to form patterns of desired size. In such cases, multiple patterning techniques can be used to allow for patterning and etching of features that can be smaller than the exposure resolution of the photolithography process. A multiple patterning process can include forming a spacer about patterned features (e.g., patterned photoresist), removing the patterned features to form patterned structures, and using the patterned structures as a mask during a subsequent etch.

Although such techniques may work relatively well in some applications, etch processes to remove the patterned features can be anisotropic, which can result in the patterned structures leaning. The leaning of the patterned structures can cause unwanted variation in the subsequent etching step and resulting pattern transfer. This phenomenon generally becomes increasingly problematic as the size of the patterned structures decreases.

Accordingly, improved methods of forming patterned structures on a surface of a substrate are desired. Further, device structures, which include the patterned structures, are also desired. And, systems for performing the method are also desired.

Any discussion of problems and solutions set forth in this section has been included in this disclosure solely for the purpose of providing a context for the present disclosure, and should not be taken as an admission that any or all of the discussion was known at the time the invention was made.

SUMMARY OF THE DISCLOSURE

Various embodiments of the present disclosure relate to methods of forming patterned structures on a surface of a substrate and to systems for forming the patterned structures. The patterned structures can be used in the formation of devices, such as semiconductor devices and other electronic devices.

While the ways in which various embodiments of the present disclosure address drawbacks of prior methods and systems are discussed in more detail below, in general, various embodiments of the disclosure provide improved methods of forming patterned structures using a layer silicon nitride. As set forth in more detail below, examples of the disclosure include use of an isotropic chemical etch to facilitate relatively uniform removal of an underlaying structure. The relatively uniform removal of the underlying structure mitigates irregular pattern transfer, such as irregular pattern transfer that can result from leaning pattern structures that can result from using other techniques.

In accordance with examples of the disclosure, a method of forming patterned structures on a surface of a substrate is disclosed. The method can be used, for, for example, multiple patterning (e.g., spacer-defined double patterning) techniques. The method includes providing a substrate comprising sacrificial features formed thereon within a reaction chamber and depositing a layer comprising silicon nitride overlying the sacrificial feature, wherein, during the step of depositing, a portion of the sacrificial features is removed. The step of depositing a layer comprising silicon nitride can include a cyclical process that includes providing a nitrogen reactant to the reaction chamber (e.g., for a nitrogen reactant pulse period—which may be continuous though one or more deposition cycles), providing a hydrogen reactant to the reaction chamber (e.g., for a hydrogen reactant pulse period—which may be continuous through one or more deposition cycles), and providing a plasma power to form a plasma within the reaction chamber for a plasma pulse period. At least a portion or a section of the sacrificial features can be isotopically removed during the step of depositing a layer comprising silicon nitride using a chemical reactant, such as a hydrogen reactant. In accordance with further examples of the disclosure, the method can further comprise a step of using reactive ion etching to remove a portion of the layer comprising silicon nitride. Additionally or alternatively, the method can include a step of removing remaining portions of the sacrificial features to thereby form the patterned structures. Additionally or alternatively the method can include a step of etching a portion of the substrate using the patterned structures. In accordance with further examples, the method includes a step of controlling an etch profile of the sacrificial features during the cyclical plasma process by manipulating one or more of a flowrate of the hydrogen reactant, a pressure within the reaction chamber, a plasma power, a substrate temperature, and a plasma power pulse time. And, in accordance with yet further examples, the method includes a step of controlling an etch profile of the sacrificial features during the cyclical plasma process by manipulating one or more of a flow ratio of the hydrogen reactant, a pressure within the reaction chamber, a plasma power, a substrate temperature, and a plasma power pulse time.

In accordance with further embodiments of the disclosure, a device structure is provided. The device structure can be formed according to a method as set forth herein. The device structure can include a substrate and one or more patterned structures formed thereon or therein.

In accordance with yet additional examples of the disclosure, a system configured to perform a method and/or form a device structure as described herein is provided.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
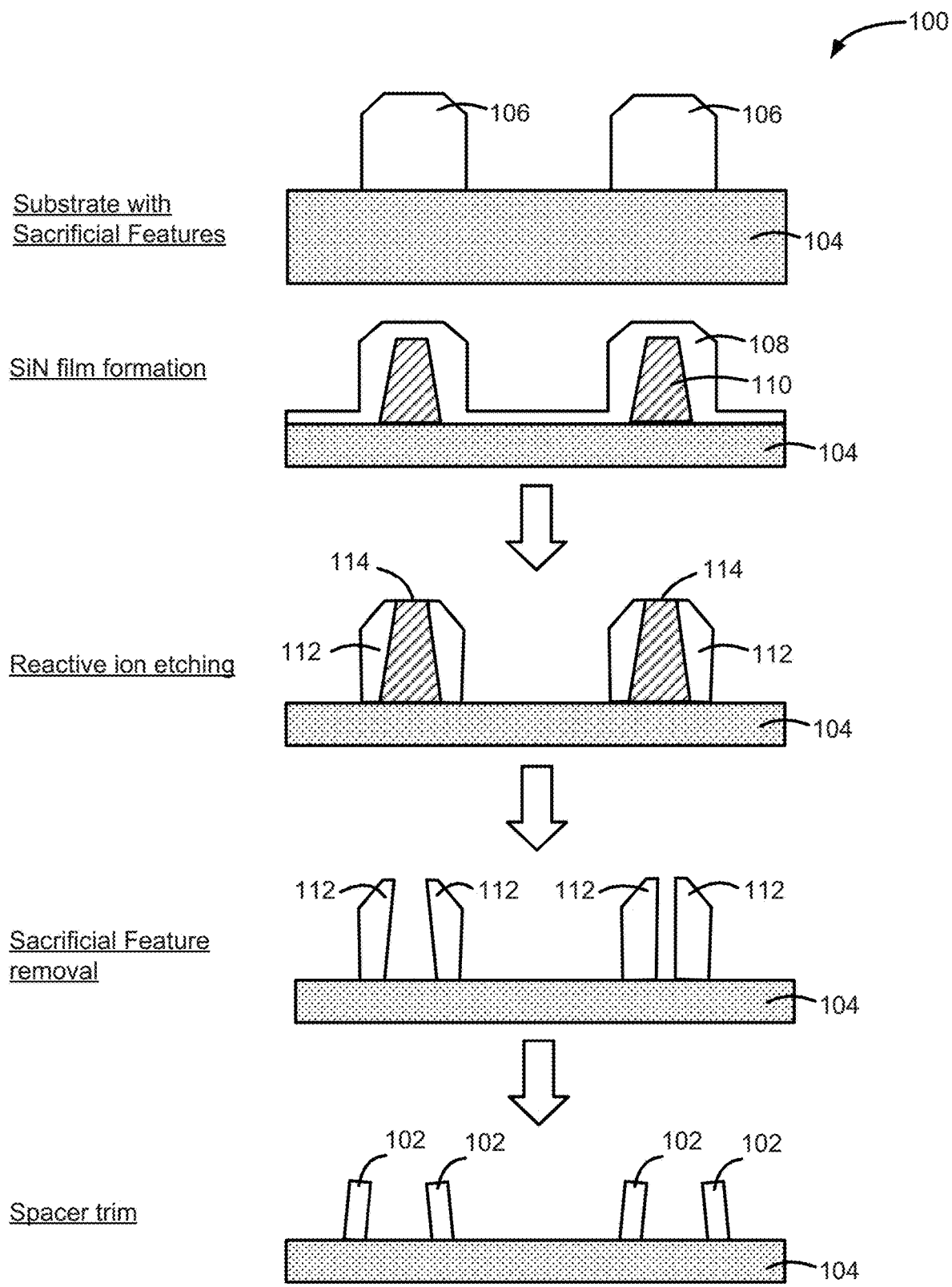
FIG. 1 illustrates formation of a device structure, which can result in undesirable variation of removal of patterned sacrificial features on a surface of a substrate.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of forming patterned structures on a surface of a substrate, to device structures including or formed using the patterned structures, and to systems for performing the methods and/or forming the device structures. As described in more detail below, exemplary methods can be used to form device structures suitable for forming electronic devices. For example, exemplary methods can be used to form patterned structures on a surface of a substrate. The patterned structures can be used as an etch mask or as patterned features for formation of a next set of patterned structures. As further set forth in more detail below, exemplary methods and systems can allow for more precise pattern transfer, more reliable device manufacturing, formation of smaller or higher pitched etch patterns, and more reliable device performance.

In this disclosure, gas may include material that is a gas at normal temperature and pressure, a vaporized solid and/or a vaporized liquid, and may be constituted by a single gas or a mixture of gases, depending on the context. A gas other than the process gas, e.g., a gas introduced without passing through a gas distribution assembly, such as a showerhead, other gas distribution device, or the like, may be used for, e.g., sealing the reaction space, and may include a seal gas, such as a rare or other inert gas. The term inert gas refers to a gas that does not take part in a chemical reaction to an appreciable extent and/or a gas that can excite a precursor when plasma power is applied. The terms precursor and reactant can be used interchangeably.

As used herein, the term substrate can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as GaAs, and can include one or more layers overlying or underlying the bulk material. Further, the substrate can include various features, such as recesses, lines, and the like formed within or on at least a portion of a layer of the substrate. By way of particular examples, a substrate can include bulk semiconductor material and/or a layer to be etched and patterned sacrificial features formed thereon.

In some embodiments, film refers to a layer extending in a direction perpendicular to a thickness direction to cover an entire target or concerned surface, or simply a layer covering a target or concerned surface. In some embodiments, layer refers to a structure having a certain thickness formed on a surface or a synonym of film or a non-film structure. A layer can be continuous or noncontinuous. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequences, and/or functions or purposes of the adjacent films or layers.

In this disclosure, continuously can refer to one or more of without breaking a vacuum, without interruption as a timeline, without any material intervening step, without changing treatment conditions, immediately thereafter, as a next step, or without an intervening discrete physical or chemical structure between two structures other than the two structures in some embodiments. For example, a reactant can be supplied continuously during two or more steps and/or deposition cycles of a method.

The term cyclic deposition process or cyclical deposition process can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component.

As used herein, the term atomic layer deposition (ALD) may refer to a vapor deposition process in which deposition cycles, preferably a plurality of consecutive or continuous deposition cycles, are conducted in a process chamber. Typically, during each cycle, a precursor is introduced and may be chemisorbed to a deposition surface (e.g., a substrate surface or a previously deposited underlying surface, such as material from a previous ALD cycle), forming a monolayer or sub-monolayer that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term atomic layer deposition, as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor composition(s), reactive gas, and purge (e.g., inert carrier) gas. PEALD refers to an ALD process, in which a plasma is applied during one or more of the ALD steps or substeps.

As used herein, the term purge may refer to a procedure in which an inert or substantially inert gas is provided to a reactor chamber in between two pulses of gases which react with each other. For example, a purge may be provided between a precursor pulse and a reactant pulse, thus avoiding or at least minimizing gas phase interactions between the precursor and the reactant. It shall be understood that a purge can be effected either in time or in space, or both. For example, in the case of temporal purges, a purge step can be used, e.g., in the temporal sequence of providing a first precursor to a reactor chamber, providing a purge gas to the reactor chamber, and providing a second precursor to the reactor chamber, wherein the substrate on which a layer is deposited does not move. For example, in the case of spatial purges, a purge step can take the following form: moving a substrate from a first location to which a first precursor is supplied, through a purge gas curtain, to a second location to which a second precursor is supplied.

As used herein, silicon nitride refers to a material that includes silicon and nitrogen. Silicon nitride can be represented by the formula $Si_3N_4$. In some cases, the silicon nitride may not include stoichiometric silicon nitride. In some cases, the silicon nitride can include other elements, such as carbon, oxygen, nitrogen, hydrogen, or the like.

As used herein, the term overlap can mean coinciding with respect to time and within a reaction chamber. For example, with regard to gas pulse periods, such as precursor pulse periods and reactant pulse periods, two or more gas pulse periods can overlap when gas from the respective pulse periods are within the reaction chamber or provided to the reaction chamber for a period of time.

Further, in this disclosure, any two numbers of a variable can constitute a workable range of the variable, and any ranges indicated may include or exclude the endpoints. Additionally, any values of variables indicated (regardless of whether they are indicated with about or not) may refer to precise values or approximate values and include equivalents, and may refer to average, median, representative, majority, or the like in some embodiments. Further, in this disclosure, the terms include, including, constituted by and having can refer independently to typically or broadly comprising, consisting essentially of, or consisting of in some embodiments. In this disclosure, any defined meanings do not necessarily exclude ordinary and customary meanings in some embodiments.

Turning now to the figures, FIG. 1 illustrates a general overview of a comparative method of forming patterned structures. 102 overlying a substrate 104. A method to form patterned structures 102 can include providing a substrate 104 having patterned (sacrificial) features 106 formed thereon. A layer of silicon nitride 108 can be formed overlying structures 106. During deposition of silicon nitride layer 108, patterned sacrificial features can be anisotropically etched, resulting in features 110. A portion of the silicon nitride layer 108 can then be removed, resulting in spacers 112 and residual features 114. Residual features 114 can be removed, and spacers 112 can be trimmed to form patterned structures 102 overlying substrate 104. Patterned structures can be used as an etch mask to etch substrate 104 (e.g., a hard mask layer overlying another layer or bulk substrate material).

As illustrated, when patterned sacrificial features 106 are substantially anisotropically etched during a silicon nitride layer deposition process, patterned structures 102 may exhibit an undesirable lean, which can result in undesired pattern transfer and/or undesired variation in pattern transfer to substrate 104. Methods described below can facilitate relatively isotropic removal of patterned sacrificial feature material and the improve pattern transfer to the underlying substrate.

Figure 2:
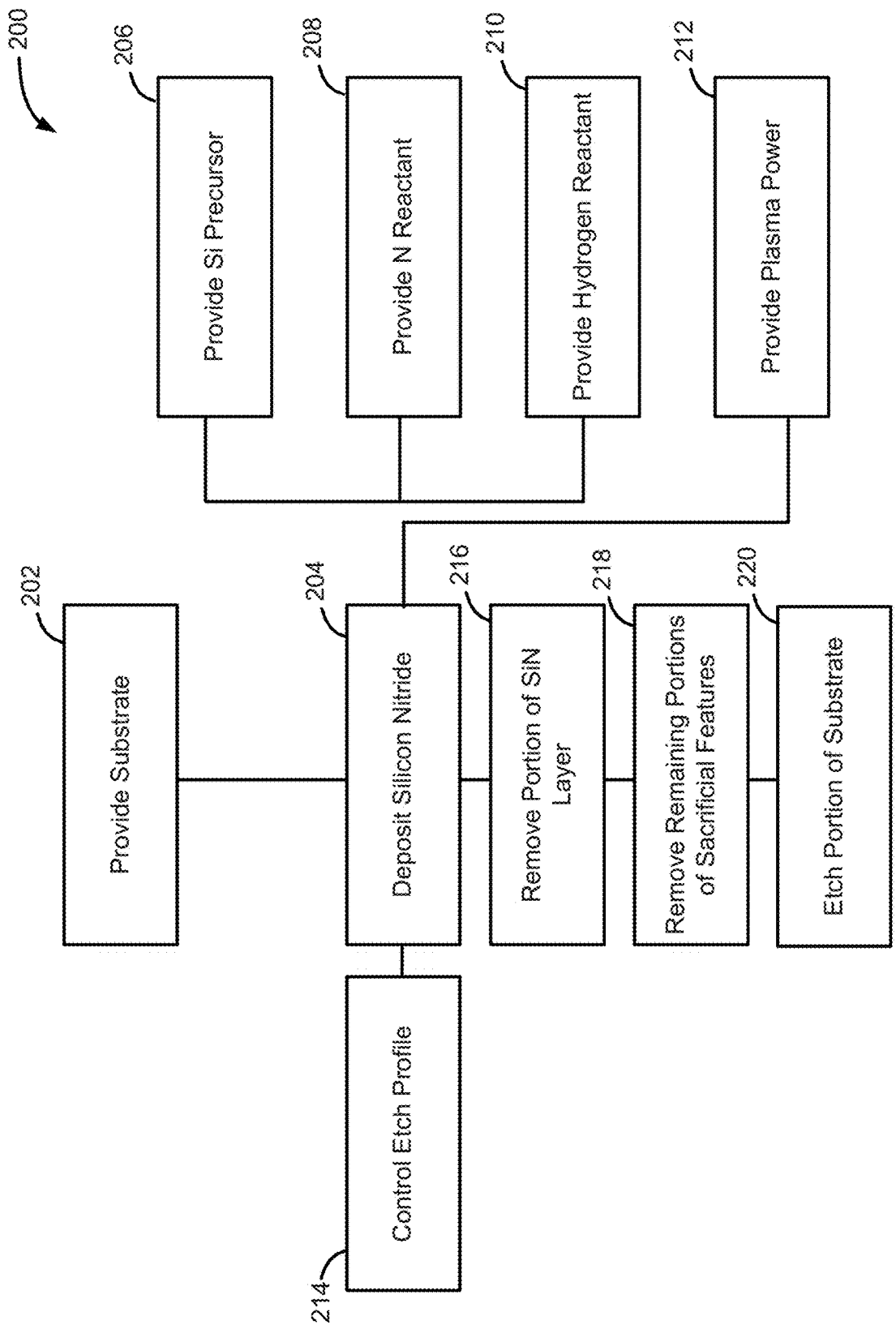
FIG. 2 illustrates a method in accordance with at least one embodiment of the disclosure.

FIG. 2 illustrates a method 200 in accordance with examples of the disclosure. Method 200 can be used to form patterned structures on a surface of a substrate, while mitigating unwanted variation in pattern transfer that can otherwise result from relatively high variation in and/or undesired pattern of material removal of patterned sacrificial features during a step of depositing a silicon nitride layer.

Method 200 include the step of providing a substrate within a reaction chamber 202 and depositing a layer comprising silicon nitride 204. Method 200 can also include removing a portion of the silicon nitride layer 216, removing remaining portions of the patterned sacrificial features 218, and etching portions of the substrate 220. Unless stated otherwise, exemplary methods need not include all such steps, but rather can include any subset of the steps.

Figure 3:
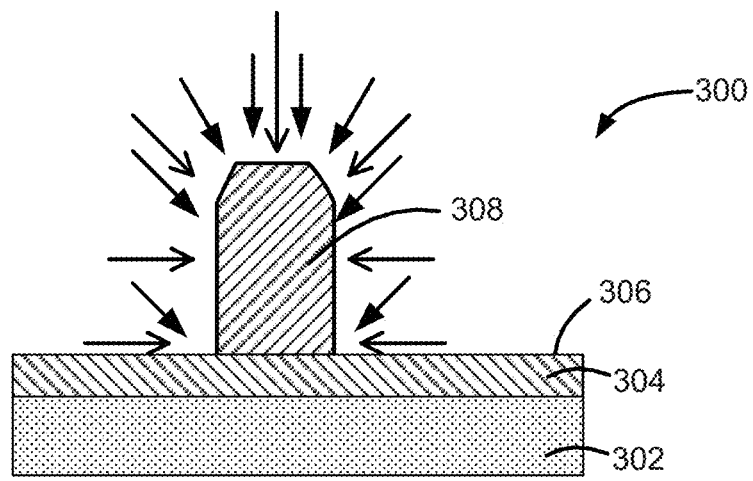
FIGS. 3-8 illustrate device structures in accordance with exemplary embodiments of the disclosure.

During step 202, a substrate comprising a surface comprising patterned (e.g., sacrificial) features is provided within a reaction chamber of a reactor system. An exemplary substrate 300 for use during step 202 is illustrated in FIG. 3. In this example, substrate 300 includes a first layer or bulk material 302, a second layer 304 (e.g., a layer to be etched), and a surface 306, including patterned sacrificial features 308. First layer or bulk material 304 can include, for example, silicon or other semiconductor material; second layer 306 can include, for example, one more materials having etching selectivity against silicon nitride; patterned sacrificial features 308 can include, for example, one or more of photoresist, spin on carbon, carbon hard mask, and spin on hard mask.

A reaction chamber used during step 202 can be or include a reaction chamber of a chemical vapor deposition reactor system configured to perform a cyclical deposition process. The reaction chamber can be a standalone reaction chamber or part of a cluster tool.

Step 202 can include heating the substrate to a desired deposition temperature within the reaction chamber. In some embodiments of the disclosure, step 202 includes heating the substrate to a temperature of less than 800° C. For example, in some embodiments of the disclosure, heating the substrate to a deposition temperature may comprise heating the substrate to a temperature between approximately 75° C. and approximately 350° C. or about 250° C. and 300° C. In addition to controlling the temperature of the substrate, a pressure within the reaction chamber may also be regulated. For example, in some embodiments of the disclosure, the pressure within the reaction chamber during step 202 may be less than 13333 Pa, about 1600 Pa and about 2400 Pa or about 10 Pa and about 13333 Pa.

During step 204, a layer of silicon nitride (e.g., silicon nitride layer 402, illustrated in FIG. 4) is formed overlying the substrate provided in step 202. Silicon nitride layer 402 can have a thickness between about 5 nm and about 20 nm or about 1 nm and about 50 nm.

Step 204 can include a cyclical process that includes: providing a silicon precursor to the reaction chamber for a silicon precursor pulse period 206, providing a nitrogen reactant to the reaction chamber for a nitrogen reactant pulse period 208, providing a hydrogen reactant to the reaction chamber for a hydrogen reactant pulse period 210, and providing a plasma power to form a plasma within the reaction chamber for a plasma pulse period 212. The pressure and/or temperature during step 204 can be the same or similar to the temperature set forth in connection with step 202.

Figure 9:
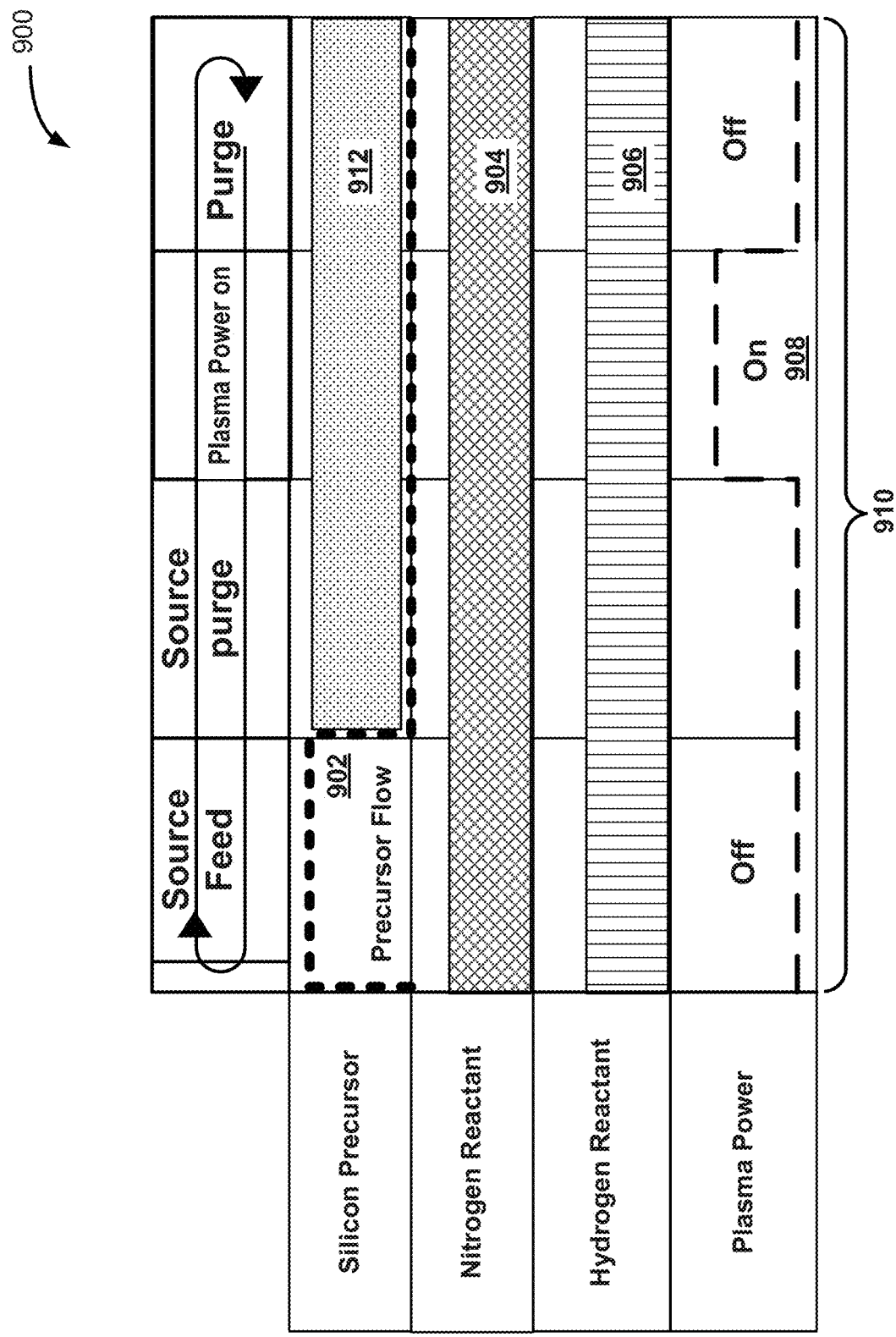
FIG. 9 illustrates a timing sequence in accordance with examples of the disclosure.

FIG. 9 illustrates an exemplary timing sequence 900 suitable for step 204 of method 200. In the illustrated example, a silicon precursor is provided to the reaction chamber for a precursor pulse period 902, a nitrogen reactant is provided to the reaction chamber for a nitrogen reactant pulse period 904, a hydrogen reactant is provided to the reaction chamber for a hydrogen reactant pulse period 906, and a (e.g., RF) plasma power is applied to form a plasma during a plasma power period 908. As illustrated, sequence 900 can include one or more deposition cycles 910; each deposition cycle including silicon precursor pulse period 902, nitrogen reactant pulse period 904, hydrogen reactant pulse period 906, and plasma power period 908. In the illustrated case, deposition cycle 910 comprises a cyclical deposition process, such as a PEALD process.

As used herein, pulse period means a period in which a gas (e.g., precursor, reactant, inert gas, and/or carrier gas) is flowed to a reaction chamber and/or a period in which power is applied (e.g., power to produce a plasma). A height and/or width of the illustrated pulse period is not necessarily indicative of a particular amount or duration of a pulse.

Sequence 900 can also include a carrier gas pulse period 912. During carrier gas pulse period 912, a carrier gas (e.g., used to facilitate providing a precursor), such as one or more of argon, helium, nitrogen alone or in any combination, is provided to the reaction chamber. A flowrate of the carrier gas can be between about 500 and about 5000 sccm.

In the illustrated example, silicon precursor pulse period 902 ceases prior to plasma power period 908. Further, pulse periods 904, 906, and a carrier gas pulse period 912 can be continuous through one or more deposition cycles 910.

Returning to FIG. 2, during step 206, a silicon precursor is provided to the reaction chamber (e.g., for a silicon precursor pulse period 902). Exemplary precursors suitable for use with precursor step 206/silicon precursor pulse period 902 can be selected from the one or more of group consisting of aminosilane, halogenated silane, monosilane, and disilane. Exemplary aminosilane and halogenated silanes include, but are not limited to, Si2Cl6, SiCl2H2, Sil2H2, bisdiethylaminosilane, bisdimethylaminosilane, hexaethylaminodisilane, tetraethylaminosilane, tert-butylaminosilane, bistert-butylaminosilane, trimethylsilyldiethylamine, trimethylsilyldiethylamine, and bisdimethylaminodimethylsilane. A precursor can be diluted with a carrier gas (e.g., about 1% to about 99% volume percent precursor in a carrier gas, depending on the precursor). A precursor with a carrier gas flow rate may be in a range of about 500 to about 5000 sccm. A duration of precursor pulse period 902 can range from about 0.05 to about 5 seconds.

During providing a nitrogen reactant to the reaction chamber for a nitrogen reactant pulse period 208, a nitrogen reactant is provided to the reaction chamber (e.g., for nitrogen reactant pulse period 904). In the illustrated example, the nitrogen reactant is provided continuously during (e.g., before, during, and after) one or more deposition cycles 910. Exemplary suitable nitrogen reactants include one or more of the nitrogen reactant is selected from the group consisting of nitrogen ($N_2$), $N_2O$ and NO. A nitrogen reactant gas flow rate may be in a range of about 100 to about 10000 sccm. A duration of step 208/nitrogen reactant pulse period 904 can range from about 0.1 to about 5 seconds or about 0.01 to about 100 seconds and/or can extend through an on or more deposition cycles 910.

During providing a hydrogen reactant to the reaction chamber for a hydrogen reactant pulse period 210/hydrogen reactant pulse period 906, a hydrogen reactant is provided to the reaction chamber. Exemplary hydrogen reactants include $H_2$, $NH_3$ and $N_2H_2$. A hydrogen reactant gas flow rate may be in a range of about 0.1 to about 2000 sccm. A duration of step 210/hydrogen reactant pulse period 906 can range from about 0.1 to about 5 seconds or about 0.01 to about 100 seconds and/or can extend through one or more deposition cycles 910.

During providing a plasma power to form a plasma within the reaction chamber for a plasma pulse period 212/plasma power period 908, a power suitable to produce a plasma is provided. The plasma may be a direct plasma—formed within the reaction chamber. In accordance with examples of the disclosure, power provided during plasma power period 212 has a frequency between about 13 MHz and about 14 MHz or about 26 MHz and about 28 MHz. The power applied during first plasma power period 214 can be greater than zero and less than 1500 W (e.g., for a 300 mm substrate) or similar power density (per surface area of a substrate) or between about 50 W and about 1500 W for a 300 mm substrate or similar power density.

Figure 4:
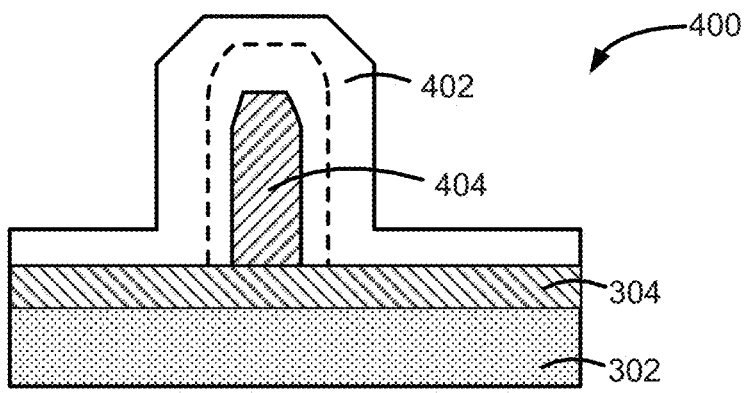

FIG. 4 illustrated a device structure after step 204/sequence 900. As a silicon nitride layer 402 is deposited during step 204 (e.g., using a plasma or other excited species deposition process), sacrificial feature 308 is bombarded with active species (shown with arrows having a filled arrowhead) and chemical species (shown with arrow having a lined arrowhead) to form residual feature 404. Use of chemical (e.g., hydrogen) etching in addition to the ion bombardment leads to a more even/isotropic etch of patterned sacrificial feature 308 (e.g., compared to feature 106), which in turn leads to more predictable, less variable pattern transfer to layer 304.

In accordance with examples of the disclosure, an etch profile of the patterned sacrificial features can be controlled, as illustrated by step 214. Step 214 can include, for example, controlling an etch profile of the sacrificial features during the cyclical plasma process by manipulating one or more of a flowrate of the hydrogen reactant, a flow ratio of the hydrogen reactant (relative to other gasses provided to the reaction chamber during step 204 and/or step 212, a pressure within the reaction chamber, a plasma power, a substrate temperature, and a plasma power pulse time. By way of particular example, a volumetric flowrate ratio of hydrogen to the other gasses can be between about 0.02% and about 0.07% or between about 0.007% and about 20%.

Figure 5:
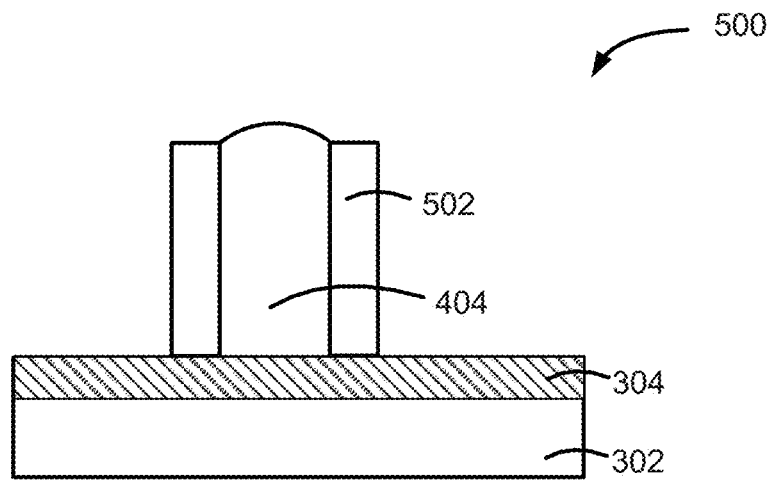

Once step 204 (e.g., timing sequence 900) is complete, a portion of the layer 402 can be removed during step 216 to form device structure 500, including patterned structures 502, also referred to as spacers, as illustrated in FIG. 5. A portion of layer 402 can be removed using, for example, a dry etch process (e.g., using activated fluorine). A reactant during the dry etch process can include, for example, $NF_3$ at about 50 to about 300° C.

Figure 6:
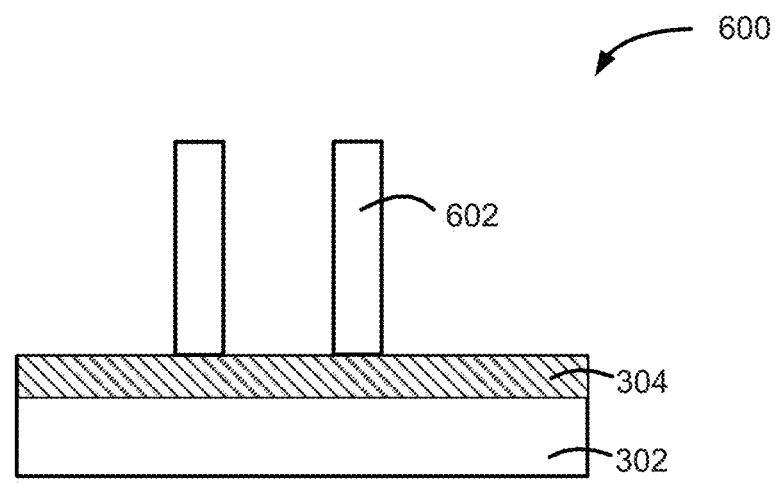

During step 218, remaining portions 404 is removed. For example, an aching process can be used to remove remaining portions 404 to form device structure 600, including features 602 (which may have been trimmed) as illustrated in FIG. 6.

Figure 7:
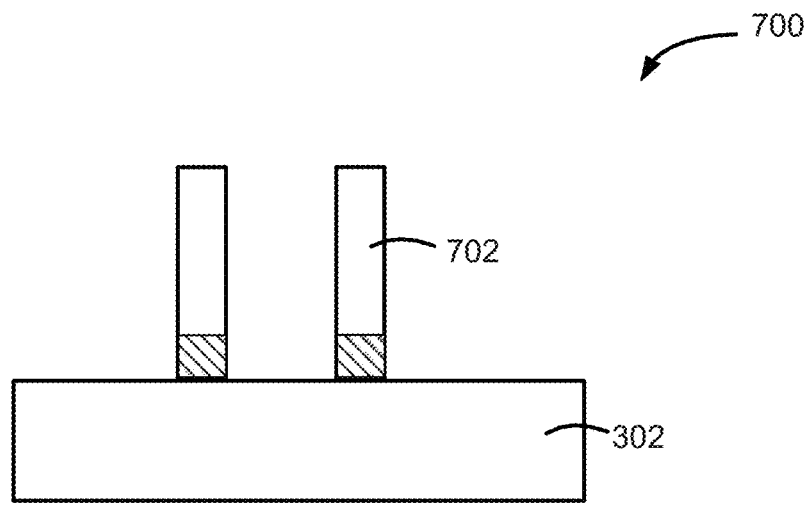
Figure 8:
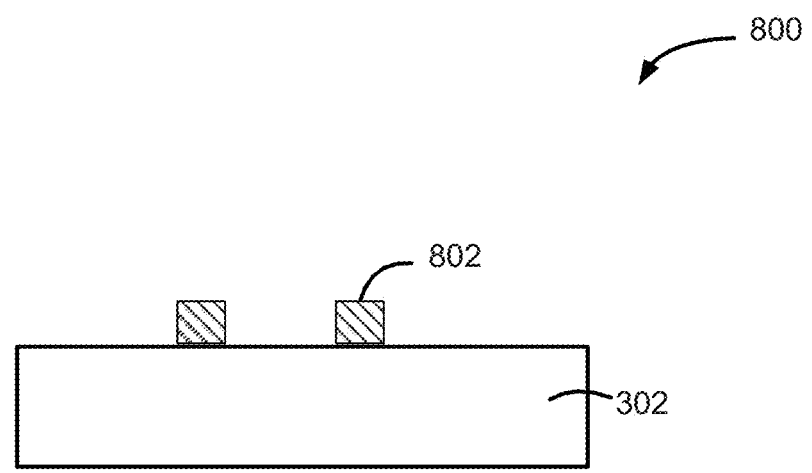

During step 220, layer 304 can be etched using patterned structures 602 as a templated mask to form device structure 700, as illustrated in FIG. 7, and features 602 can be removed to form device structure 800, illustrated in FIG. 8, which includes patterned structure 802. Device structure 700 includes substrate 304 and patterned structures 702 formed thereon. Any suitable etch process can be used to form features 702 and 802 and will generally depend on the composition of layer 304. Patterned structures can be used as a hard mask to etch an underlying layer or can be used for next steps in a multiple patterning process.

Figure 10:
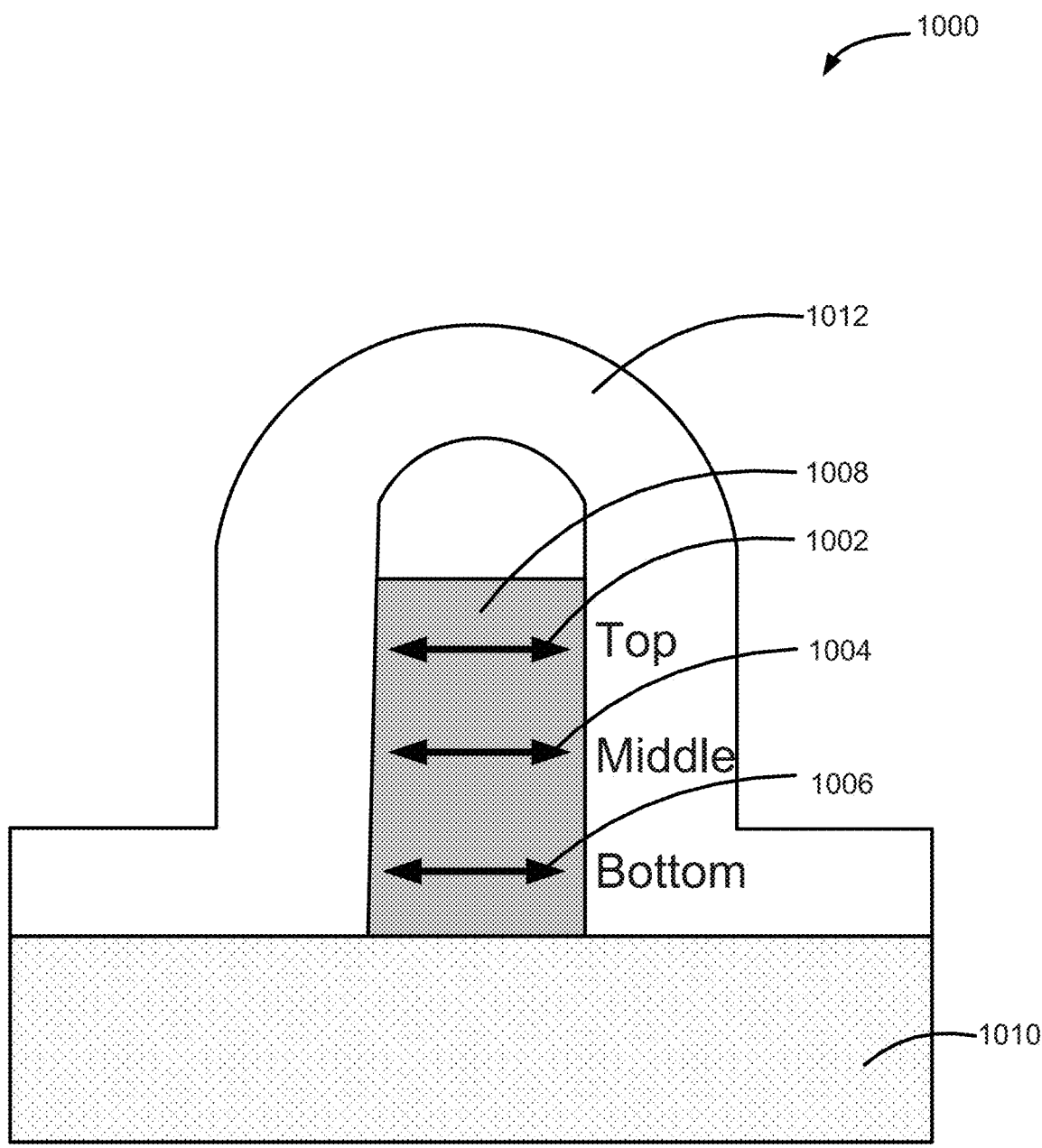
FIG. 10 illustrates locations of film thickness measurements.
Figure 11:
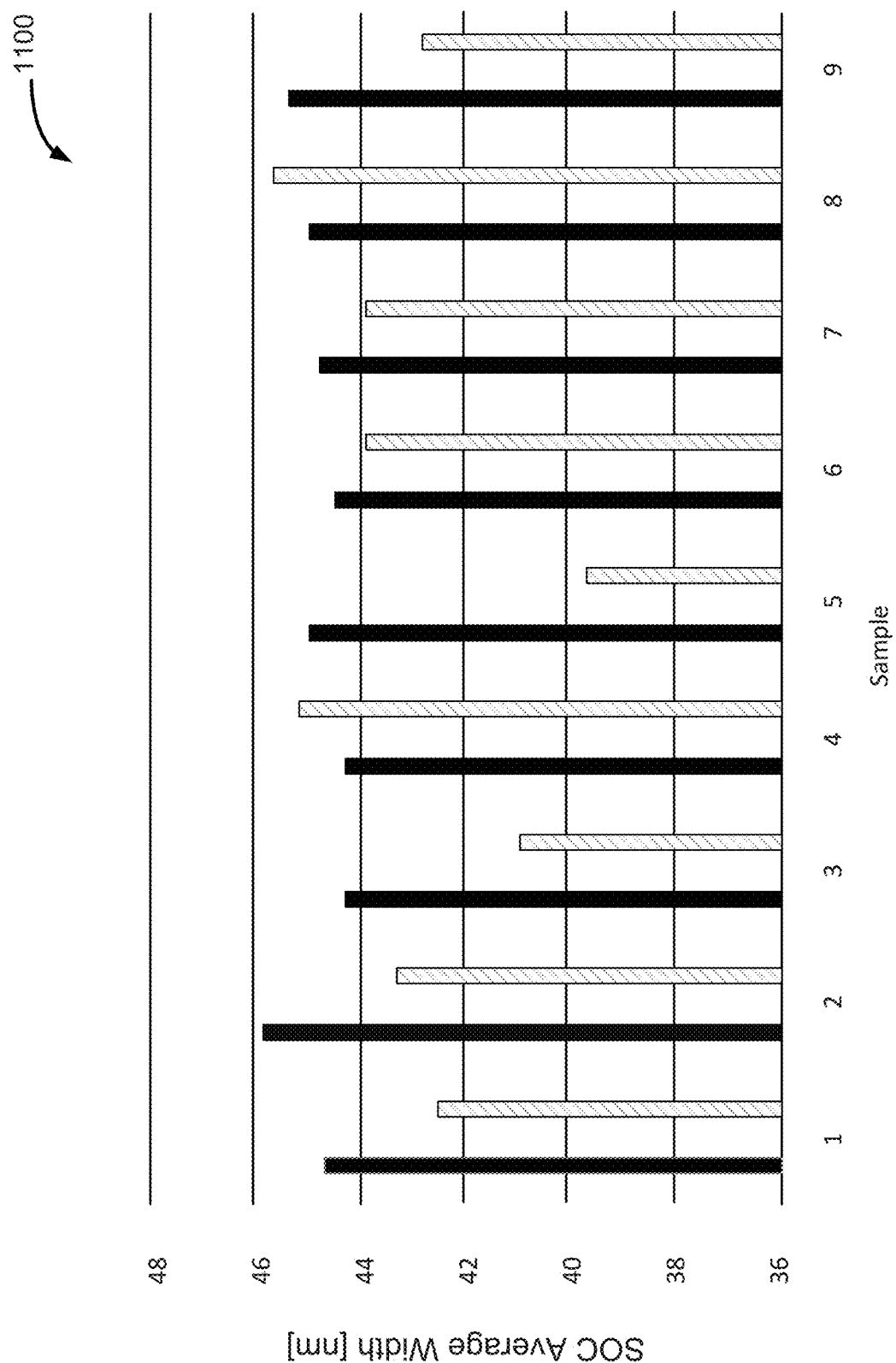
FIG. 11 illustrates sacrificial feature measurements of samples after deposition of a layer of silicon nitride in accordance with examples of the disclosure.
Figure 12:
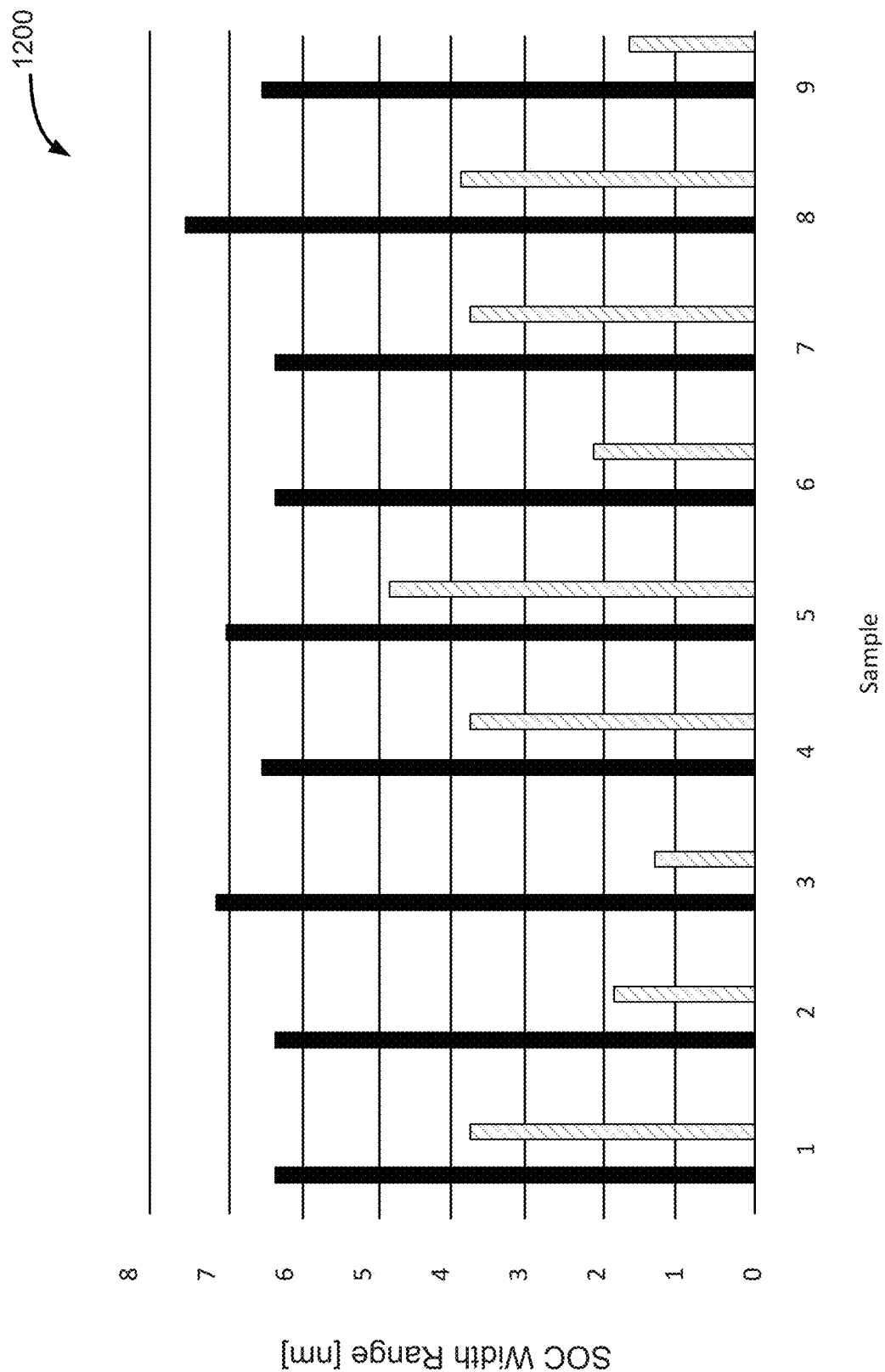
FIG. 12 illustrates variation in patterned sacrificial feature measurements of samples after deposition of a layer of silicon nitride in accordance with examples of the disclosure

FIG. 10 illustrates a structure 1000, indicating measurement locations of a sacrificial feature 1008, overlying a substrate 1010 and underlying a silicon nitride layer 1012. In the illustrated structure, top 1002, middle 1004, and bottom 1006 locations are illustrated. FIG. 11 illustrated average width data 1100 for samples that were formed without hydrogen during a silicon nitride deposition step (solid bars) and for samples that included hydrogen (shaded bars) during the deposition step (e.g., deposition step 204). As illustrated, providing hydrogen during deposition generally reduces an average width of the sacrificial features (e.g., features 308) during a silicon nitride layer deposition step. FIG. 12 illustrates width ranges (e.g., range of measurements at locations 1002-106) for sacrificial features that were formed without hydrogen during the deposition step and for samples that included hydrogen during the deposition step (e.g., step 204). As illustrated a range of the measurements at various locations of the sacrificial substrates was substantially less when hydrogen is added to the deposition step, compared to samples that were formed without providing hydrogen during the deposition step.

Figure 13:
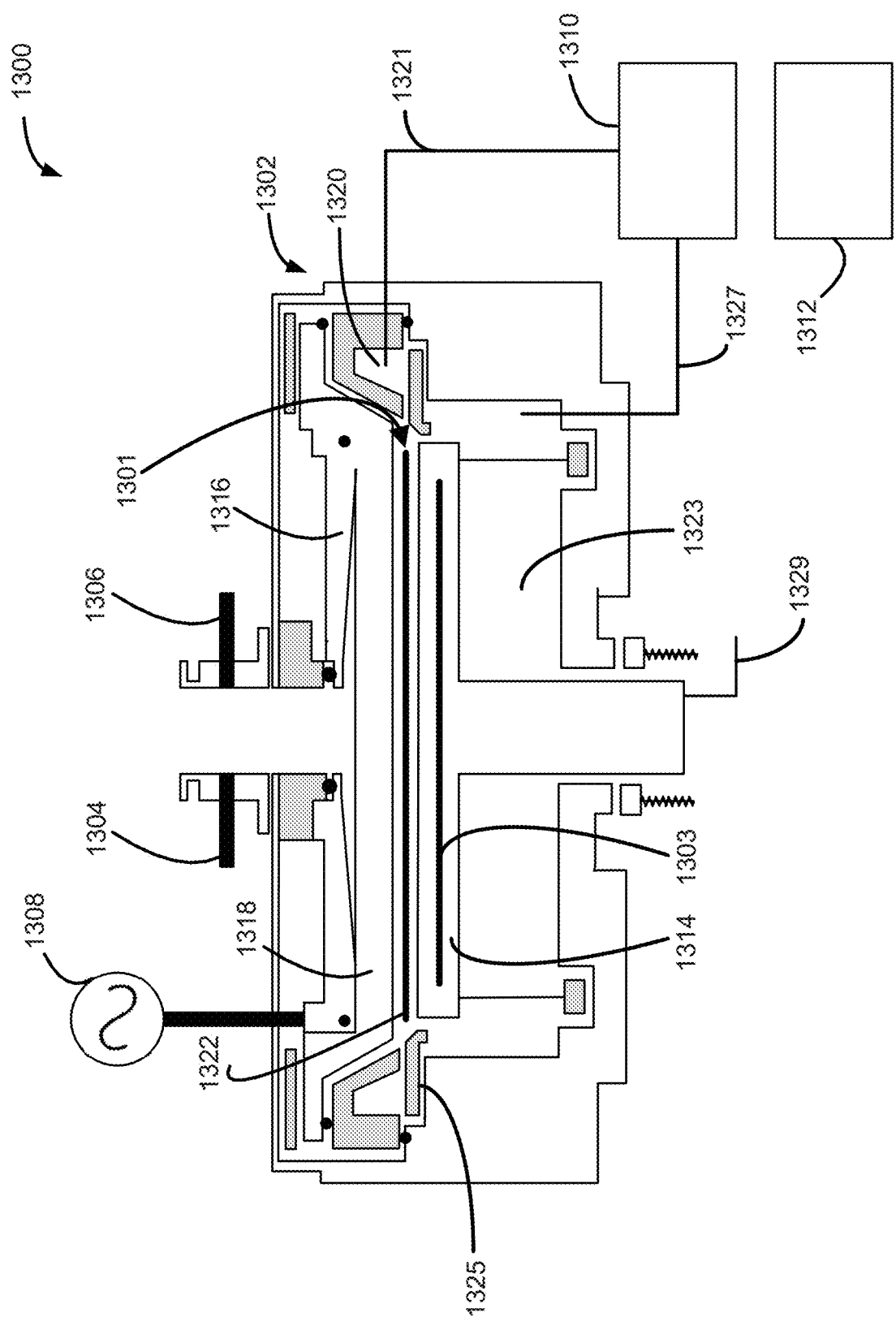
FIG. 13 illustrates a system in accordance with at least one embodiment of the disclosure.

Turning now to FIG. 13, a reactor system 1300 in accordance with exemplary embodiments of the disclosure is illustrated. Reactor system 1300 can be used to perform one or more steps or substeps as described herein and/or to form one or more device structures or portions thereof as described herein.

Reactor system 1300 includes a pair of electrically conductive flat-plate electrodes 1314, 1318 in parallel and facing each other in an interior 1301 (reaction zone) of a reaction chamber 1302. Although illustrated with one reaction chamber 1302, system 1300 can include two or more reaction chambers. A plasma can be excited within reaction chamber 1302 by applying, for example, RF power from plasma power source(s) 1308 to one electrode (e.g., electrode 1318) and electrically grounding the other electrode (e.g., electrode 1314). A temperature regulator 1303 can be provided in a lower stage 1314 (the lower electrode), and a temperature of a substrate 1322 placed thereon can be kept at a desired temperature, such as the temperatures noted above. Electrode 1318 can serve as a gas distribution device, such as a shower plate or showerhead. Precursor gases, reactant gases, and a carrier or inert gas, if any, or the like can be introduced into reaction chamber 1302 using one or more gas lines (e.g., reactant gas line 1304 and precursor gas line 1306, respectively, coupled to a reactant source and a precursor source). For example, an inert gas and a reactant (e.g., as described above) can be introduced into reaction chamber 1302 using line 1304 and/or a precursor and a carrier gas (e.g., as described above) can be introduced into the reaction chamber using line 1306. Although illustrated with two inlet gas lines 1304, 1306, reactor system 1300 can include any suitable number of gas lines.

In reaction chamber 1302, a circular duct 1320 with an exhaust line 1321 can be provided, through which gas in the interior 1301 of the reaction chamber 1302 can be exhausted to an exhaust source 1310. Additionally, a lower process chamber 1323 can be provided with a seal gas line 1329 to introduce seal gas into the interior 1301 of reaction chamber 1302 via the interior (transfer zone) of transfer chamber 1323, wherein a separation plate 1325 for separating the reaction zone and the transfer chamber 1323 can be provided (a gate valve through which a substrate is transferred into or from transfer chamber 1323 is omitted from this figure). Transfer chamber 1323 can also be provided with an exhaust line 1327 coupled to an exhaust source 1310. In some embodiments, continuous flow of a carrier gas to reaction chamber 1302 can be accomplished using a flow-pass system (FPS).

Reactor system 1300 can include one or more controller(s) 1312 programmed or otherwise configured to cause one or more method steps as described herein to be conducted. Controller(s) 1312 are coupled with the various power sources, heating systems, pumps, robotics and gas flow controllers, or valves of the reactor, as will be appreciated by the skilled artisan. By way of example, controller 1312 can be configured to control gas flow of a precursor, a reactant, and an inert gas into at least one of the one or more reaction chambers to form a layer on a surface of a substrate. Controller 1312 can be further configured to provide power—e.g., within reaction chamber 1302. Controller 1312 can be similarly configured to perform additional steps as described herein. By way of examples, controller 1312 can be configured to control gas flow of a precursor and a reactant into at least one of the one or more reaction chambers to form a silicon nitride layer overlying a substrate.

Controller 1312 can include electronic circuitry and software to selectively operate valves, manifolds, heaters, pumps and other components included in system 1300. Such circuitry and components operate to introduce precursors, reactants, and purge gases from the respective sources. Controller 1312 can control timing of gas pulse sequences, temperature of the substrate and/or reaction chamber, pressure within the reaction chamber, and various other operations to provide proper operation of the system 1300.

Controller 1312 can include control software to electrically or pneumatically control valves to control flow of precursors, reactants, and/or purge gases into and out of the reaction chamber 1302. Controller 1312 can include modules such as a software or hardware component, e.g., a FPGA or ASIC, which performs certain tasks. A module can advantageously be configured to reside on the addressable storage medium of the control system and be configured to execute one or more processes.

In some embodiments, a dual chamber reactor (two sections or compartments for processing substrates disposed close to each other) can be used, wherein a reactant gas and a noble gas can be supplied through a shared line, whereas a precursor gas is supplied through unshared lines.

During operation of system 1300, substrates, such as semiconductor wafers, are transferred from, e.g., a substrate handling area 1323 to the reaction zone 1301. Once substrate (s) are transferred to reaction zone 1301, one or more gases, such as precursors, reactants, carrier gases, and/or purge gases, are introduced into reaction chamber 1302.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to the embodiments shown and described herein, such as alternative useful combinations of the elements described, may become apparent to those skilled in the art from the description. Such modifications and embodiments are also intended to fall within the scope of the appended claims.

What is claimed is:

1. A method of forming patterned structures on a surface of a substrate, the method comprising the steps of:
   providing a substrate comprising sacrificial features formed thereon within a reaction chamber; and
   using a cyclical plasma process, depositing a layer comprising silicon nitride overlying the sacrificial features, the step of depositing the layer comprising silicon nitride comprising:
      providing a silicon precursor to the reaction chamber for a silicon precursor pulse period;
      providing a nitrogen reactant to the reaction chamber;
      providing a hydrogen reactant to the reaction; and
      providing a plasma power to form a plasma within the reaction chamber for a plasma pulse period,
   wherein, during the step of depositing, a portion of the sacrificial features is isotropically removed.

2. The method of claim 1, wherein the nitrogen reactant is selected from the group consisting of $N_2O$ and NO.

3. The method of claim 1, wherein the hydrogen reactant comprises $NH_3$ or $N_2H_2$.

4. The method of claim 1, wherein a volumetric percent of hydrogen reactant in gas provided to the reaction chamber during the step of providing a plasma power is between about 0.02% and about 0.07%.

5. The method of claim 1, wherein the cyclical plasma process comprises a plasma-enhanced atomic layer deposition process.

6. The method of claim 1, wherein a frequency of power used during the cyclical plasma process is between about 26 MHz and about 28 MHz.

7. The method of claim 1, wherein a plasma power during the plasma pulse period is greater than zero and less than 1500 W.

8. The method of claim 1, wherein the silicon precursor pulse period, providing the nitrogen reactant, and providing the hydrogen reactant overlap.

9. The method of claim 1, wherein the plasma pulse period, providing the nitrogen reactant, and providing the hydrogen reactant overlap.

10. The method of claim 1, wherein the nitrogen reactant is continuously supplied to the reaction chamber during the cyclical plasma process.

11. The method of claim 1, wherein the hydrogen reactant is continuously supplied to the reaction chamber during the cyclical plasma process.

12. The method of claim 1, further comprising a step of using reactive ion etching to remove a portion of the layer comprising silicon nitride.

13. The method of claim 1, further comprising a step of controlling an etch profile of the sacrificial features during the cyclical plasma process by manipulating one or more of a flowrate of the hydrogen reactant, a pressure within the reaction chamber, a plasma power, a substrate temperature, and a plasma power pulse time.

14. The method of claim 1, further comprising a step of controlling an etch profile of the sacrificial features during the cyclical plasma process by manipulating one or more of a flow ratio of the hydrogen reactant, a pressure within the reaction chamber, a plasma power, a substrate temperature, and a plasma power pulse time.

15. The method of claim 1, wherein the sacrificial features comprise one or more of photoresist, spin on carbon, carbon hard mask, and spin on hard mask.

16. The method of claim 1, wherein a substrate temperature during the step of depositing the layer comprising silicon nitride is between about 250° C. and about 300° C. or about 75° C. and about 350° C.

17. The method of claim 1, wherein a pressure within the reaction chamber during the step of depositing the layer comprising silicon nitride is between about 1600 Pa and about 2400 Pa.

18. The method of claim 1, further comprising a step of removing remaining portions of the sacrificial features to thereby form the patterned structures.

19. The method of claim 18, further comprising a step of etching a portion of the substrate using the patterned structures.

* * * * *